United States Patent
O'Toole et al.

(10) Patent No.: US 9,267,983 B2
(45) Date of Patent: Feb. 23, 2016

(54) TESTING LED LIGHT SOURCES

(75) Inventors: Eamonn O'Toole, Castletroy (IE);
Timothy Davern, Castletroy (IE);
Michael Crowley, Castletroy (IE)

(73) Assignee: Feasa Enterprises Limited, Castleroy Co. Limerick (IE)

( * ) Notice: Subject to any disclaimer, the term of this patent is extended or adjusted under 35 U.S.C. 154(b) by 638 days.

(21) Appl. No.: 13/415,294

(22) Filed: Mar. 8, 2012

(65) Prior Publication Data

US 2012/0306527 A1    Dec. 6, 2012

(30) Foreign Application Priority Data

Mar. 2, 2011   (GB) .................................. 1103528.4

(51) Int. Cl.
| | |
|---|---|
| *G01R 31/02* | (2006.01) |
| *G01R 31/26* | (2014.01) |
| *G01J 1/04* | (2006.01) |
| *G01J 1/02* | (2006.01) |
| *G01J 1/42* | (2006.01) |

(52) U.S. Cl.
CPC ........... *G01R 31/2635* (2013.01); *G01J 1/0252* (2013.01); *G01J 1/0425* (2013.01); *G01J 2001/4247* (2013.01)

(58) Field of Classification Search
CPC ..... G01R 31/2874–31/2877; G01J 2001/4247; G01J 1/0252–1/0425
USPC ............................ 324/762.02, 750.03–750.09
See application file for complete search history.

(56) References Cited

U.S. PATENT DOCUMENTS

| | | | | |
|---|---|---|---|---|
| 7,812,624 | B1 * | 10/2010 | Wei et al. | 324/762.07 |
| 8,329,453 | B2 * | 12/2012 | Battrell et al. | 435/287.2 |
| 2003/0161163 | A1 * | 8/2003 | Hussey et al. | 362/487 |
| 2004/0232820 | A1 | 11/2004 | Jansma | |
| 2007/0132470 | A1 | 6/2007 | Kamakura | |
| 2008/0205482 | A1 * | 8/2008 | Cao et al. | 374/178 |

FOREIGN PATENT DOCUMENTS

| | | | | |
|---|---|---|---|---|
| CN | 1510430 | * | 7/2004 | H01L 21/66 |
| CN | 1510430 A | | 7/2004 | |
| CN | 2010 17022 Y | | 2/2008 | |
| CN | 201017022 | * | 2/2008 | G01R 31/26 |
| CN | 202159131 | * | 3/2012 | G01R 31/44 |
| JP | 5333092 A | | 12/1993 | |

OTHER PUBLICATIONS

Search Report for Application No. GB 1103528.4 dated Apr. 27, 2011.
European Search Report for Application No. EP 12 15 7543 dated Jun. 29, 2012.
Office Action for European Application No. 12 157 543.5 dated Apr. 2, 2013.

* cited by examiner

*Primary Examiner* — Melissa Koval
*Assistant Examiner* — Trung Nguyen
(74) *Attorney, Agent, or Firm* — Alston & Bird LLP

(57) ABSTRACT

An apparatus for testing light emitting diodes (LEDs) comprising a chamber which is configured to heat or cool LEDs inside the chamber by ambient heating or cooling of the LEDs and an optical sensing unit configured to sense light emitted by the LEDs while the LEDs are inside the chamber. A method for testing LEDs is also described.

12 Claims, 3 Drawing Sheets

TESTING LED LIGHT SOURCES

FIELD OF THE INVENTION

The invention relates to an apparatus and method for testing light emitting diode (LED) light sources. Particularly, but not exclusively, the invention relates to an apparatus and method for lumen maintenance testing of light emitting diode light sources in accordance with particular standards or references including environmental testing, lifetime testing and burn in testing, for example, but not limited to, IESNA LM e.g. IESNA LM-80.

SUMMARY OF THE INVENTION

According to the invention, there is provided an apparatus for testing light emitting diodes (LEDs) comprising: a chamber which is configured to heat or cool LEDs inside the chamber by ambient heating or cooling of the LEDs; and a light collecting unit configured to collect light emitted by the LEDs whilst the LEDs are inside the chamber.

A temperature control unit may be configured to cause the ambient heating or cooling of the LEDs by increasing, decreasing or maintaining an ambient temperature inside the chamber.

The temperature control unit may be configured to temporally increase and maintain the ambient temperature according to predetermined requirements such as an IESNA standard e.g. IESNA LM-80.

The chamber may be sealable to prevent escape or entry of external air from/to the chamber.

The light collecting unit may be disposed inside the chamber.

The light collecting unit may be configured to feed light collected from the LEDs to a light analysis unit located outside of the chamber, which may be configured to determine at least one of the wavelength, XY chromaticity, colour temperature and intensity of the collected light.

The light collecting unit may comprise one or more light collecting heads positioned such that light emitted from each of the LEDs is collected by an individually associated collecting head.

An individual communication channel, for example an optical fibre, can be provided between each light collecting unit and the light analysis unit for communication of light collected by the collecting unit to the light analysis unit.

The individual communication channels may pass from inside to outside the chamber via a seal in a shell of the chamber.

The optical sensing unit may be configured to operate in an ambient temperature range of, for example, between −55 degrees Celsius and 125 degrees Celsius.

The apparatus may be configured to create substantially the same temperature on all sides of the LEDs for heating or cooling of the LEDs.

The invention also includes a method for testing LEDs comprising: heating or cooling one or more LEDs inside a chamber by ambient heating or cooling; and collecting light emitted by the one or more LEDs whilst the LEDs are inside the chamber.

Collecting the light emitted by the LEDs may be carried out concurrently with the ambient heating or cooling.

Heating or cooling of the LEDs may comprise temporally heating and maintaining the ambient temperature inside the chamber to heat the LEDs according to predetermined requirements, which may correspond to those of the lumen maintenance test defined in an IESNA LM standard e.g. IESNA LM-80.

The heating or cooling of the LEDs comprises creating substantially the same temperature on all sides of the LEDs for heating or cooling the LEDs.

BRIEF DESCRIPTION OF THE DRAWINGS

Embodiments of the invention will now be described, for the purposes of example only, in which.

DETAILED DESCRIPTION

Figure 1:
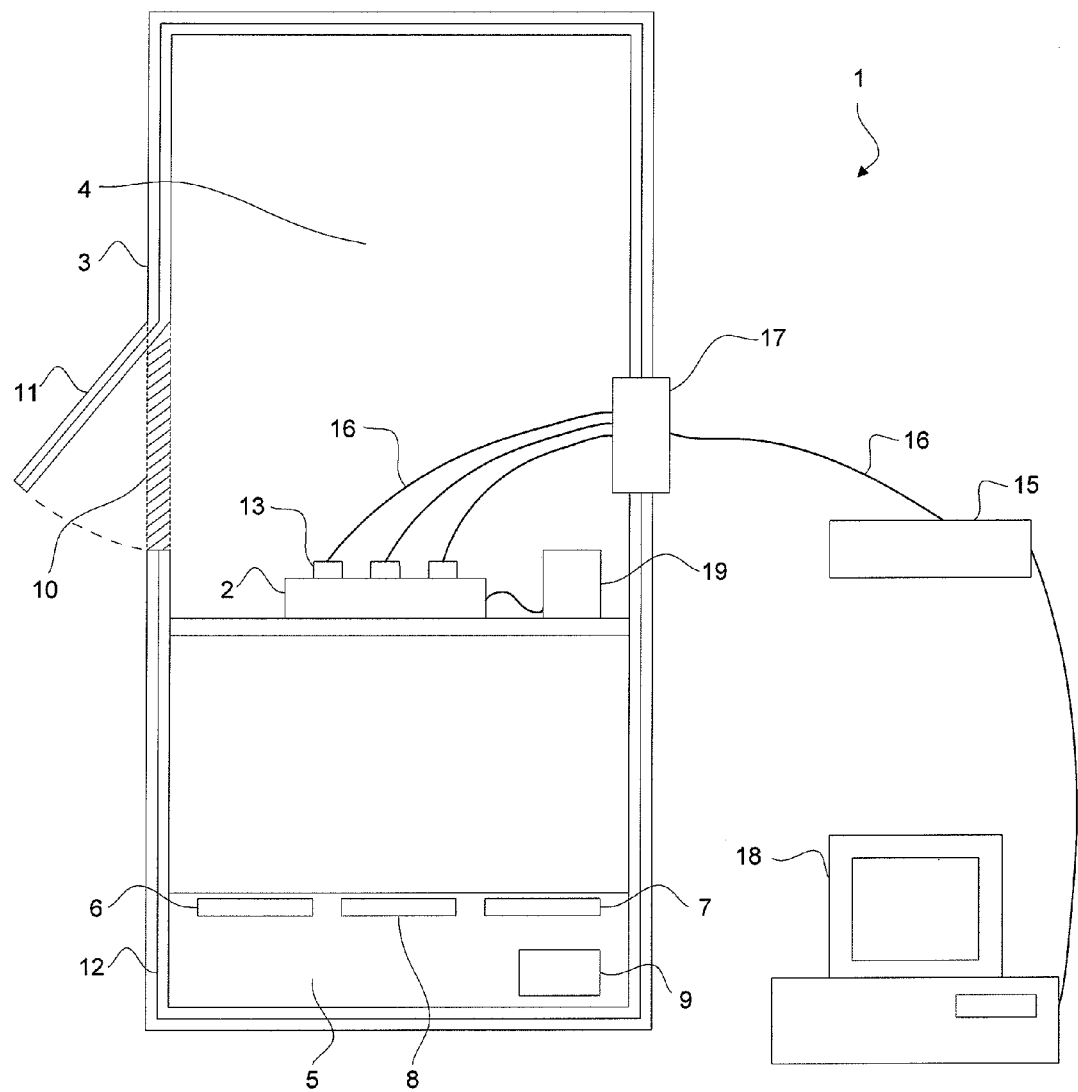
FIG. 1 is a schematic diagram of apparatus for lumen maintenance testing of an LED light source.

The invention provides an apparatus and method for testing LED light sources which is less labour intensive than conventional techniques. The light output of the LED can be measured continuously whilst the LED is exposed on all sides to temperatures over a wide range. Temperature dependent changes in the light output, such as changes in colour or intensity, can thereby be detected. For example, the apparatus and method can be used for lumen maintenance testing of LED light sources.

An important characteristic of an LED light source is its resistance to ageing, particularly in terms of whether the amount of light output by the source reduces significantly as the source gets older. In the illumination industry this characteristic of a light source is measured by carrying out a lumen maintenance test, which compares the as-new light output of a source with the light output of the source as-measured after a defined period of use.

The result of the lumen maintenance test is usually expressed as a 'lumen maintenance' value, although it can also be expressed in terms of 'lumen depreciation'. For example, a 30% reduction in lumen output from the as-new lumen output of a light source is expressed as a lumen maintenance of 70% and a lumen depreciation of 30%. It is common for a lumen maintenance of 70% to be written as 'L70', where 'L' stands for lumen maintenance and '70' indicates that 70% of the original light output still remains.

L70 is considered as a benchmark in the industry, since it is generally acknowledged that the human eye is only sensitive to lumen depreciation of 30% or more. Therefore, useful lifetime estimates for LED lighting products are typically given in terms of the expected number of operating hours until the light output has diminished to 70% of initial levels. This can be denoted as L70 life.

The lumen maintenance characteristics of an LED light source are currently generally tested according to the standard defined in IESNA LM-80-2008, which aims to allow a reliable comparison of test results for LED light sources by establishing uniform test methods. IESNA LM-80-2008 prescribes that LED packages, arrays or modules are tested over time at a minimum of three discrete case temperatures: 55 degrees Celsius, 85 degrees Celsius and one further temperature such as 25 degrees Celsius. Light output is measured at least every 1,000 hours over a minimum period of 6,000 hours use. From the resulting test data, LED manufacturers are able to make projections of useful life, such as L70 life, by extrapolation.

Luminaire manufacturers use the LM-80 test results as part of their submissions to the ENERGY STAR program. An ENERGY STAR qualification provides a degree of confidence to consumers when purchasing LED lighting products. For example, luminaires awarded the ENERGY STAR qualification are described as using 75% less energy and lasting 15 times longer than incandescent bulbs, having efficiency as good as or better than fluorescent lighting, turning on instantly, producing less heat than an incandescent bulb and thereby reducing air-conditioning needs and being durable—performing well outdoors and in cold temperatures.

The LM-80 test is conventionally carried out by powering on the LED and using an oven to age it at the elevated temperatures specified in the test. The LED is removed from the oven to a room-temperature laboratory every 1,000 hours in order to perform the light output measurements required by the test.

Additionally other important characteristic of LEDs can be determined by performing lifetime testing (−55° C. to +120° C. for example) and measuring the characteristics of the LED while cycling the LEDs between the two temperatures. Environmental testing and burn in testing can also be used to test for reliability or stability of LEDs at either high or low temperatures.

FIG. 1 shows a climate control chamber 1 for testing LED light sources 2, including LED packages, LED arrays and LED modules. The chamber 1 may be a heating and/or cooling chamber 1 and comprises an outer shell 3 and an internal cavity 4 into which the LED light sources 2 can be placed for testing. The chamber 1 can be used for lumen maintenance testing, for example in accordance with IESNA LM-80-2008, as described in more detail below. Other types of test can also be carried out using the chamber 1 such as XY chromaticity, wavelength, colour temperature and CCT.

The temperature in the cavity 4 is controllable. For example, a temperature control unit 5, which may comprise one or more heating elements 6 configured to heat the cavity 4 and/or one or more cooling units 7, such as refrigerant circuits, configured to cool the cavity 4, may be attached to or incorporated into the chamber 1. The temperature control unit 5 is configured to increase, decrease and/or maintain the ambient temperature inside the cavity 4 as required. At least one temperature sensor 8 is connected to or integrated into the temperature control unit 5 for sensing the temperature of the air or other gas in the cavity 4. For example, for the purposes of carrying out a lumen maintenance test for an LED light source 2, the temperature control unit 5 may increase or decrease the temperature of the air inside the cavity 4 to 25 degrees Celsius before maintaining the ambient temperature at 25 degrees Celsius for a period required by a standardized test. Other examples of ambient temperatures at which the temperature control unit 5 may set and maintain in the cavity 4, for example during lumen maintenance testing in accordance with IESNA LM-80-2008, are 55 degrees Celsius and 85 degrees Celsius. The temperature control unit 5 may, in fact, be configured to attain and maintain an ambient temperature inside the cavity 4 of any temperature value within a range having a lower limit of minus 55 degrees Celsius and an upper limit of 125 degrees Celsius.

The temperature control unit 5 may operate under the control of a controller 9, such as a microcontroller, which may be incorporated into the temperature control unit 5 or may be separate. The controller 9 is configured to receive control signals from the temperature sensor 8 indicating the ambient temperature of the cavity 4 and to cause the temperature control unit 5 to heat or cool the cavity 4 as required to attain or maintain a particular temperature, for example by activating the heating element 6 or refrigerant circuit 7 referred to above. The controller 9 may be operable under the control of a computer program, which may include machine-readable instructions for causing the temperature profile of the cavity 4 to be varied or maintained in a particular way. For example, when executed by a processor in the controller 9, the computer program may cause the ambient temperature of the cavity 4 to be varied in accordance with the lumen maintenance test specified in LM-80-2008 or another standard. The computer program may be stored on a computer memory such as ROM in the controller 9. The temperature control unit 5 may additionally or alternatively by operable under the control of user-activated controls such as a keyboard. These controls may be integrated into or connected to the controller 9.

The shell 3 of the chamber 1 comprises a suitable opening 10 through which objects such as the LED light sources 2 can be inserted into and removed from the cavity 4. The opening 10 in the shell 3 may be sealed during testing of the LED products 2. For example, the shell 3 may comprise a door 11 which can be closed during testing to seal the cavity 4 and prevent escape or entry of air.

Therefore, the chamber 1 can provide a sealed environment in which the ambient temperature can be accurately controlled during lumen maintenance testing, independently of the external temperature and other atmospheric conditions, by the temperature control unit 5. During testing, the LED light sources 2 inside the cavity 4 are heated or cooled by the surrounding air in the cavity 4 to the temperatures required. Once the light sources 2 have reached the temperature required for testing, the temperature of the surrounding air maintains the light sources 2 at the required temperature for as long as required. Optionally, the light sources 2 are heated or cooled entirely by the surrounding air and are not placed in contact or in close proximity with the walls, ceiling or floor of the cavity 4. The light sources 2 may be placed in the cavity 4 so that the surrounding air heats or cools them from all sides. Although the heating and cooling described above is described in terms of air, it will be understood that a pure gas or a different mixture of gases could be used inside the cavity.

The shell 3, including the door 11, may comprise heat-insulating materials 12 which insulate the cavity 4 against heat loss or heat gain to/from the exterior of the chamber 1. The heat-insulating materials 12 reduce the amount of energy required by the temperature control unit 5 to set and maintain the ambient temperature of the cavity 4 at a value which is different to the temperature at the exterior of the chamber 1.

A light collecting unit 13 is positioned for collecting light emitted from the LED light sources 2 inside the cavity 4, for example during lumen maintenance testing. For example, as shown in FIG. 1, the light collecting unit 13 can be present inside the cavity 4 and can be positioned directly adjacent the LED light sources 2 so as to receive light emitted from them. In FIG. 1 the light collecting unit 13 is positioned directly above the LED light sources 2, although the light collecting unit 13 could alternatively be placed either below or to the side of the light sources 2.

The light collecting unit 13 is fabricated from high and low temperature resistant materials so that it can operate fully when exposed to the range of ambient temperatures which may be present in the cavity 4, for example those used for LED lumen maintenance testing. The light collecting unit 13 can operate in at least the temperature range discussed above of between −55 and +125 degrees Celsius.

Figure 2:
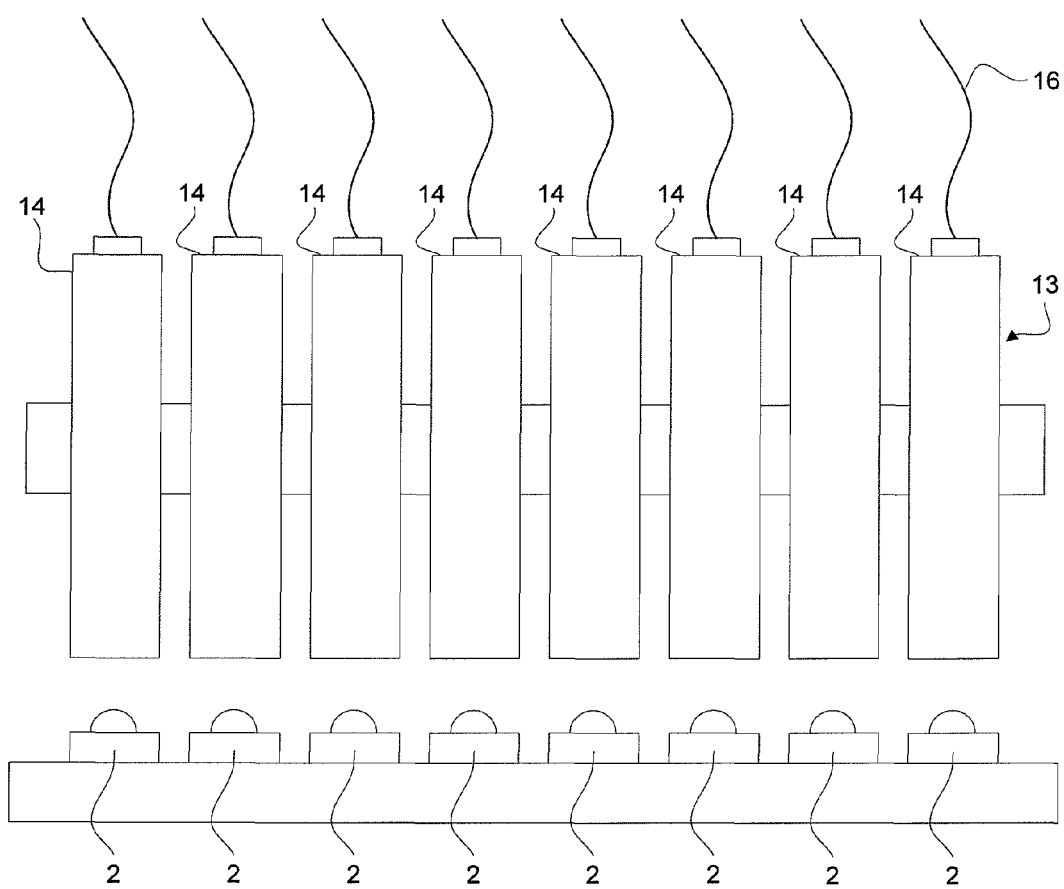
FIG. 2 is a schematic diagram of an optical sensing unit for sensing light emitted by an LED light source.

Referring to FIG. 2, the light collecting unit 13 comprises a plurality of light collecting heads 14 mounted on a mounting plate of the light collecting unit 13. The light collecting heads 14 may be formed of heat resistant materials such as glass and may comprise one or more lenses configured to receive and collect the light emitted from the LED light source(s) 2 during lumen maintenance testing or another type of test. The light collecting unit 13 may comprise a large number of the light collecting heads 14, for example 100, so that there are at least as many collecting heads 14 as there are LEDs under test. An individual light collecting head 14 can therefore be provided to collect light from each individual LED 2 under test. As shown in FIG. 2, the light collecting heads 14 can be positioned directly above the LEDs.

Light collected by the light collecting unit 13 can be in one or more of visible light, infra-red light and ultra-violet light.

Signals indicative of the intensity, colour and other parameters of the light output by the LEDs under test are communicated from the light collecting unit 13 to an analysis unit 15. For example, the light collected at the light collecting unit 13 may be channeled directly to the analysis unit 15 via one or more communication channels 16, as described below. As shown in FIG. 1, the analysis unit 15 is located outside the chamber 1 so that it is not exposed to the more extreme ambient temperatures present inside the cavity 4 during lumen maintenance testing or another type of test. Communication between the light collecting unit 13 and the analysis unit 15 may be facilitated by one or more communication fibres 16, such as optical fibres 16, connected between the light collecting unit 13 and the analysis unit 15. The one or more optical fibres 16 may pass from the inside of the chamber 1 to the outside through a suitable bung 17 in the shell 3 of the chamber 1. The bung 17 is sealed to the walls of the shell 3 and around the optical fibre(s) 16 so as to prevent air from entering and exiting the cavity 4 during testing. Therefore, as shown in FIG. 1, a first section of the optical fibre(s) 16 resides inside the chamber 1 and a second section of the optical fibre(s) 16 resides outside of the chamber 1. The first section of the fibre(s) 16 is fabricated from high and low temperature resistant materials such as glass so that the fibre(s) 16 can operate at the temperatures present inside the cavity 4 during testing. The second section of the fibre(s) 16 is also optionally formed of the same materials.

Referring to FIGS. 1 and 2, an individual optical fibre 16 may be connected between each light collecting head 14 and the analysis unit 15 to provide an individual measurement channel for each LED 2 under test. Therefore, the analysis unit 15 can determine a colour reading and an intensity reading for each individual LED 2 under test using the light received via the optical fibres 16. The readings can be made during the exposure of the LED light sources 2 to the extreme ambient temperatures in the cavity 4 during the lumen maintenance, or any other, test. Light is collected by the optical collecting unit 13 continuously and so the colour and intensity readings can be taken either continuously or as frequently as required. This provides an advantage over conventional testing methods, in which light readings for the LEDs are taken at infrequent intervals such as every 1,000 hours. Furthermore, since the light readings can be taken during all-round exposure of the LEDs 2 to extreme ambient temperatures in the cavity 4 during testing, temperature dependent changes in the colour or intensity of the light emitted by the LEDs can be detected by the analysis unit 15. By exposing all sides of the LED units 2 to the same temperature in the cavity 4, the chamber 1 can also be used to test the deterioration of the casing at the front of the LED units 2 caused by exposure of the casings to high and low temperatures.

The analysis unit 15 is configured to receive the light collected by the light collecting unit 13 and to record parameters of the light in a predetermined manner. The analysis unit 15 may, for example, be configured to prepare a lumen maintenance test report in accordance with LM-80-2008 on the basis of the measured parameters of the light received from the light collecting unit 13. The analysis unit 15 may be implemented in software or hardware. For example, referring to FIG. 1, the analysis unit 15 may be a self-contained device. The device 15 can comprise a memory storing a computer program which, when executed by a processor, is configured to cause the lumen maintenance test report to be generated. The lumen maintenance report may be transmitted from the analysis unit 15 to a computer apparatus 18 such as a PC for long-term storage or printing. From here, the report can be viewed on a display of the computer apparatus 18. The computer apparatus 18 may be configured so that the report can be recorded in a web page, which may be made accessible by one or more third parties over the Internet. Optionally, the computer apparatus 18 records the report in the web page automatically.

Alternatively, the analysis unit 15 may be implemented entirely in software stored in a memory of the computer apparatus 18. The computer program referred to above can thus be executed by a processor in the computer apparatus 18. In this case, the computer apparatus 18 may be directly coupled to the light collecting unit 13 via the optical fibre(s) 16 described above.

Figure 3:
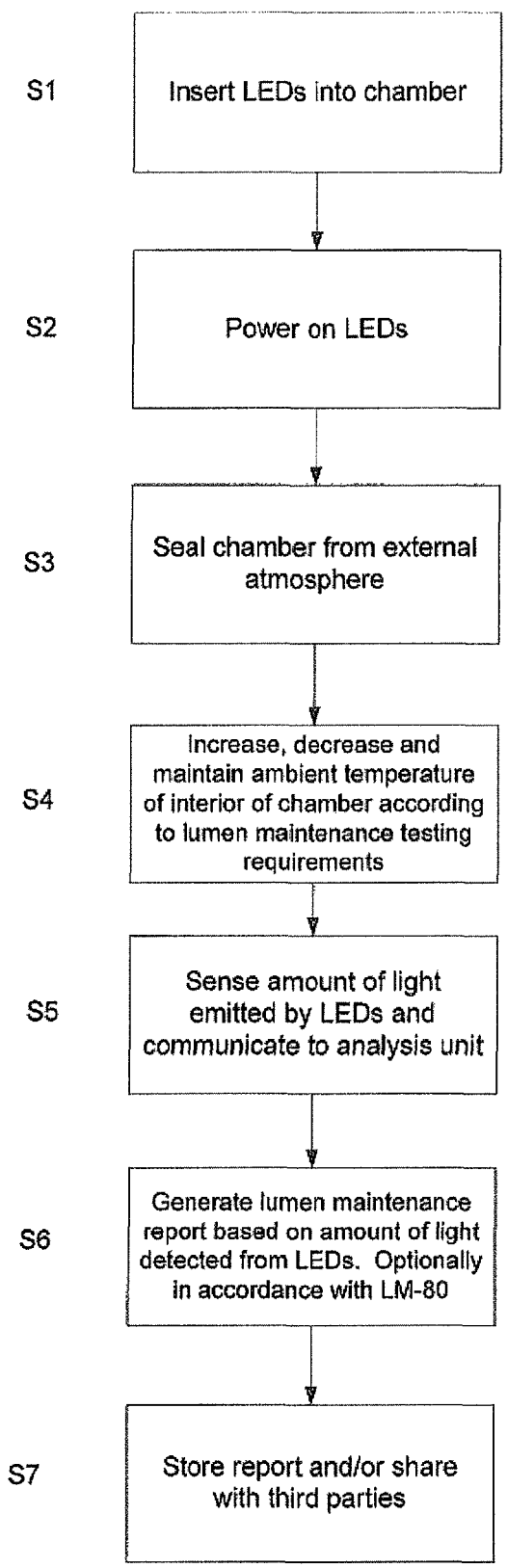
FIG. 3 is a flow diagram of a method of carrying out a lumen maintenance test for an LED light source.

Referring to FIG. 3, a first step S1 of a method of testing LED light sources 2 comprises placing one or more LED light sources 2 in the chamber for lumen maintenance testing 1. The light sources 2 are positioned in the cavity 4 of the chamber 1 such that light emitted from the LEDs 2 will be received directly by the heads 14 of the light collecting unit 13. In a second step S2, the LED light sources 2 are powered on so as to emit light. The power required for illumination may be provided to the LEDs by a power supply unit 19, which can either be integrated into the chamber 1 or can be separate. The first and second steps S1, S2 are interchangeable. In a third step S3, the chamber 1 is sealed to prevent escape/entry of air or other gases from/to the cavity 4. In a fourth step, the ambient temperature of the cavity 4 is increased or decreased or maintained, as required, by the temperature control unit 5. The ambient temperature of the cavity 4 may be set at a specified value and maintained for a specified period according to the requirements of a lumen maintenance test, such as that specified in LM-80-2008, being carried out. In a fifth step S5, simultaneous with the fourth step S4, light emitted by the LED light sources 2 is collected by the collecting heads 14 of the light collecting unit 13. The light collected by each collecting head 14 is communicated to the analysis unit 15, which, in a sixth step S6, measures parameters of the light such as colour and intensity and causes the measured values to be stored. These measured parameters can be used to generate a lumen maintenance report, for example in accordance with LM-80. In a seventh step S7, the report may be stored in a computer memory or shared with third parties in a manner as previously described.

The alternatives described above can be used singly or in combination to achieve the effects of the invention. It will be appreciated that the described alternatives are not exhaustive examples of the invention. Although the apparatus and method have been described in substantially relation to lumen maintenance testing of LEDs, the apparatus and method can alternatively be used for other types of testing and are not limited to lumen maintenance tests.

The invention claimed is:

1. An apparatus for testing light emitting diodes (LEDs) comprising:
 a chamber which is configured to heat or cool LEDs under test inside the chamber by ambient heating or cooling of the LEDs;
 at least one temperature sensor configured to sense the ambient temperature of air or other gas in the chamber;
 a light collecting unit located inside the chamber, wherein the light collecting unit is configured to collect light emitted by the LEDs whilst the LEDs are being ambiently heated or cooled inside the chamber, wherein the light collecting unit is configured to feed light collected from the LEDs via individual light measurement channels to a light analysis unit located outside of the chamber; and
 a temperature control unit configured to cause the ambient heating or cooling of the LEDs by increasing, decreasing or maintaining an ambient temperature inside the chamber, based on the sensed ambient temperature.

2. An apparatus according to claim 1, wherein the temperature control unit is configured to temporally increase and maintain the ambient temperature according to predetermined requirements.

3. An apparatus according to claim 2, wherein the predetermined requirements correspond to those of the lumen maintenance test defined in the IESNA LM-80 standard.

4. An apparatus according to claim 1, wherein the chamber is sealable to prevent escape or entry of external air from/to the chamber.

5. An apparatus according to claim 1, wherein the light analysis unit is configured to determine at least one of a wavelength, XY chromaticity, colour temperature and intensity of the collected light.

6. An apparatus according to claim 1, wherein the light collecting unit comprises one or more light collecting heads positioned such that light emitted from each of the LEDs is collected by an individually associated collecting head.

7. An apparatus according to claim 6, wherein an individual communication channel is provided between each of said light collecting heads and the light analysis unit for communication of light collected by the collecting heads to the light analysis unit.

8. An apparatus according to claim 7, wherein each communication channel comprises an optical fibre which passes from inside the chamber to outside the chamber via a seal in a shell of the chamber.

9. An apparatus according to claim 1, wherein the light collecting unit is configured to operate in an ambient temperature range of between −55 degrees Celsius and 125 degrees Celsius.

10. An apparatus according to claim 1, wherein the chamber is configured to create substantially the same temperature on all sides of the LEDs for heating or cooling of the LEDs.

11. An apparatus according to claim 1, wherein the light is one or more of visible light, infra-red light and ultra-violet light wavelength ranges.

12. A method for testing light emitting diodes (LEDs) comprising:
 sensing the ambient temperature of air or other gas in a chamber;
 heating or cooling one or more LEDs under test inside the chamber by ambient heating or cooling, based on the sensed ambient temperature;
 collecting light emitted by the one or more LEDs by a light collecting unit whilst the LEDs are being ambiently heated or cooled inside the chamber; and
 feeding the collecting light via individual light measurement channels to a light analysis unit located outside of the chamber.

* * * * *